(12) United States Patent
Sanchez et al.

(10) Patent No.: US 7,505,266 B2
(45) Date of Patent: Mar. 17, 2009

(54) FAN HOUSING FOR AN INFORMATION HANDLING SYSTEM

(75) Inventors: Anthony Sanchez, Round Rock, TX (US); William K. Coxe, III, Round Rock, TX (US); Raymond DeWine Heistand, II, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 184 days.

(21) Appl. No.: 11/552,798

(22) Filed: Oct. 25, 2006

(65) Prior Publication Data

US 2008/0101021 A1    May 1, 2008

(51) Int. Cl.
*H05K 7/20* (2006.01)
(52) U.S. Cl. .................... 361/695; 361/687; 361/697; 165/80.3; 165/104.33; 165/121; 165/122; 454/184
(58) Field of Classification Search .............. 361/687, 361/690–697, 704–712, 717–720, 724–727; 165/80.3, 104.33, 104.34, 121–126, 185; 454/184; 257/718–727; 174/16.3, 252; 248/505, 248/510; 29/890.03, 832, 840
See application file for complete search history.

(56) References Cited

U.S. PATENT DOCUMENTS

| | | | | |
|---|---|---|---|---|
| 4,475,687 A | * | 10/1984 | Schulz et al. | 237/12.3 A |
| 5,874,292 A | * | 2/1999 | McMinn, Jr. | 435/262 |
| 6,236,564 B1 | * | 5/2001 | Fan | 361/695 |
| 6,667,882 B2 | * | 12/2003 | Pauser | 361/695 |
| 6,676,197 B2 | * | 1/2004 | Ozawa | 296/187.03 |
| 6,711,013 B2 | * | 3/2004 | Wobig et al. | 361/687 |
| 6,714,411 B2 | * | 3/2004 | Thompson et al. | 361/695 |
| 6,716,099 B2 | * | 4/2004 | Pfleiderer et al. | 454/41 |
| 6,822,863 B1 | * | 11/2004 | Artman et al. | 361/695 |
| 7,054,155 B1 | * | 5/2006 | Mease et al. | 361/695 |
| 7,230,826 B2 | * | 6/2007 | Kyle et al. | 361/695 |
| 7,251,136 B2 | * | 7/2007 | Yang et al. | 361/695 |
| 7,295,436 B2 | * | 11/2007 | Cheon | 361/699 |
| 2004/0004812 A1 | | 1/2004 | Curlee et al. | |
| 2004/0136159 A1 | | 7/2004 | Hein | |

OTHER PUBLICATIONS

U.S. Appl. No. 11/532,016, filed Sep. 14, 2006, Pav.

* cited by examiner

*Primary Examiner*—Michael V Datskovskiy
(74) *Attorney, Agent, or Firm*—Haynes and Boone, LLP

(57) ABSTRACT

A fan housing includes a shroud defining an air passageway. A housing member is located adjacent the air passageway and moveably coupled to the shroud such that the housing member is moveable relative to the shroud between an operating position and a service position. A fan housing is defined by the housing member, whereby the fan housing is inaccessible when the housing member is in the operating position and the fan housing is accessible when the housing member is in the service position. The shroud and housing member may be coupled to an information handling system chassis and adjacent a heat producing component. A fan may then be positioned in the fan housing when the housing member is in the service position. The housing member is then moved to the operating position and the fan is operated in order to cool the heat producing component.

18 Claims, 10 Drawing Sheets

FAN HOUSING FOR AN INFORMATION HANDLING SYSTEM

BACKGROUND

The present disclosure relates generally to information handling systems, and more particularly to a fan housing for use in an information handling system chassis.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Most IHSs include a plurality of heat producing components. The cooling requirements for some heat producing components such as, for example, Fully Buffered Dual Inline Memory Modules (FBDIMMs) in a fully configured IHS can raise a number of issues.

Typically, in order to satisfy the cooling requirements of such heat producing components, additional fans are added to the IHS chassis. However, because of the desire to make the IHS chassis as small as possible, the positioning of these fans is limited. Some solutions incorporate hinged air baffles that direct air towards the heat producing component. Such hinged parts often wear out and the directing of air can result in losses in airflow and less cooling than is optimal for the additional fans. Some solutions require tools to rigidly attach the solution to the chassis, which increases manufacturing times and costs associated with the building and service of the IHS.

Accordingly, it would be desirable to provide for cooling heat producing components in an IHS absent the disadvantages found in the prior methods discussed above.

SUMMARY

According to one embodiment, a fan housing apparatus includes a shroud defining an air passageway, a housing member located adjacent the air passageway and moveably coupled to the shroud such that the housing member is moveable relative to the shroud between an operating position and a service position, and a fan housing defined by the housing member, whereby the fan housing is inaccessible when the housing member is in the operating position and the fan housing is accessible when the housing member is in the service position.

BRIEF DESCRIPTION OF THE DRAWINGS

FIG. 2b is a perspective view illustrating an embodiment of the fan housing apparatus of FIG. 2a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
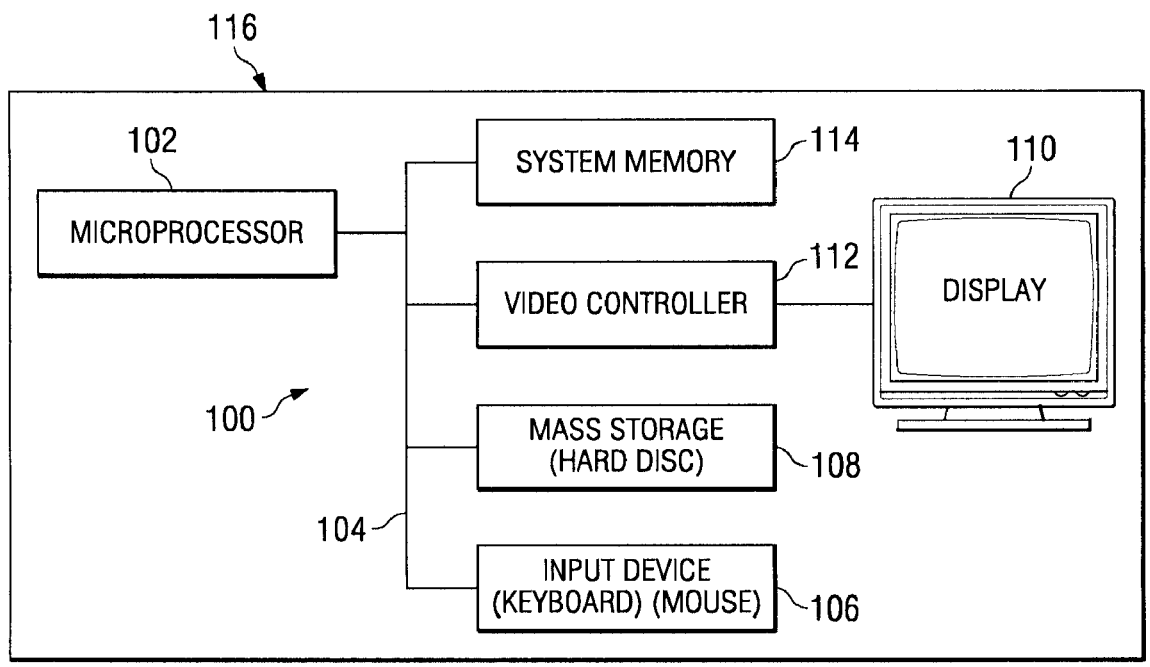
FIG. 1 is a schematic view illustrating an embodiment of an IHS.
Figure 5A:
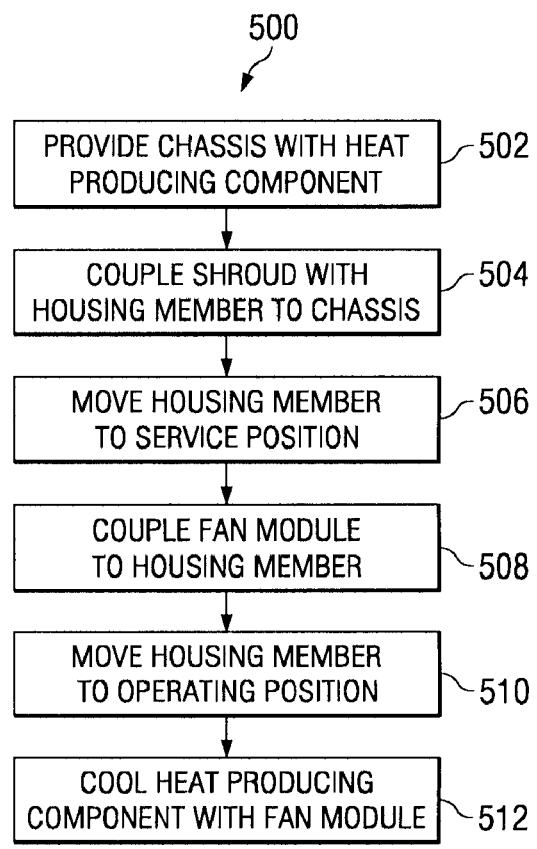
FIG. 5a is a flow chart illustrating an embodiment of a method for cooling a heat producing component.

In one embodiment, IHS 100, FIG. 1, includes a processor 102, which is connected to a bus 104. Bus 104 serves as a connection between processor 102 and other components of computer system 100. An input device 106 is coupled to processor 102 to provide input to processor 102. Examples of input devices include keyboards, touchscreens, and pointing devices such as mouses, trackballs and trackpads. Programs and data are stored on a mass storage device 108, which is coupled to processor 102. Mass storage devices include such devices as hard disks, optical disks, magneto-optical drives, floppy drives and the like. IHS 100 further includes a display 110, which is coupled to processor 102 by a video controller 112. A system memory 114 is coupled to processor 102 to provide the processor with fast storage to facilitate execution of computer programs by processor 102. In an embodiment, a chassis 116 houses some or all of the components of IHS 100.

It should be understood that other buses and intermediate circuits can be deployed between the components described above and processor 102 to facilitate interconnection between the components and the processor 102.

Figure 2A:
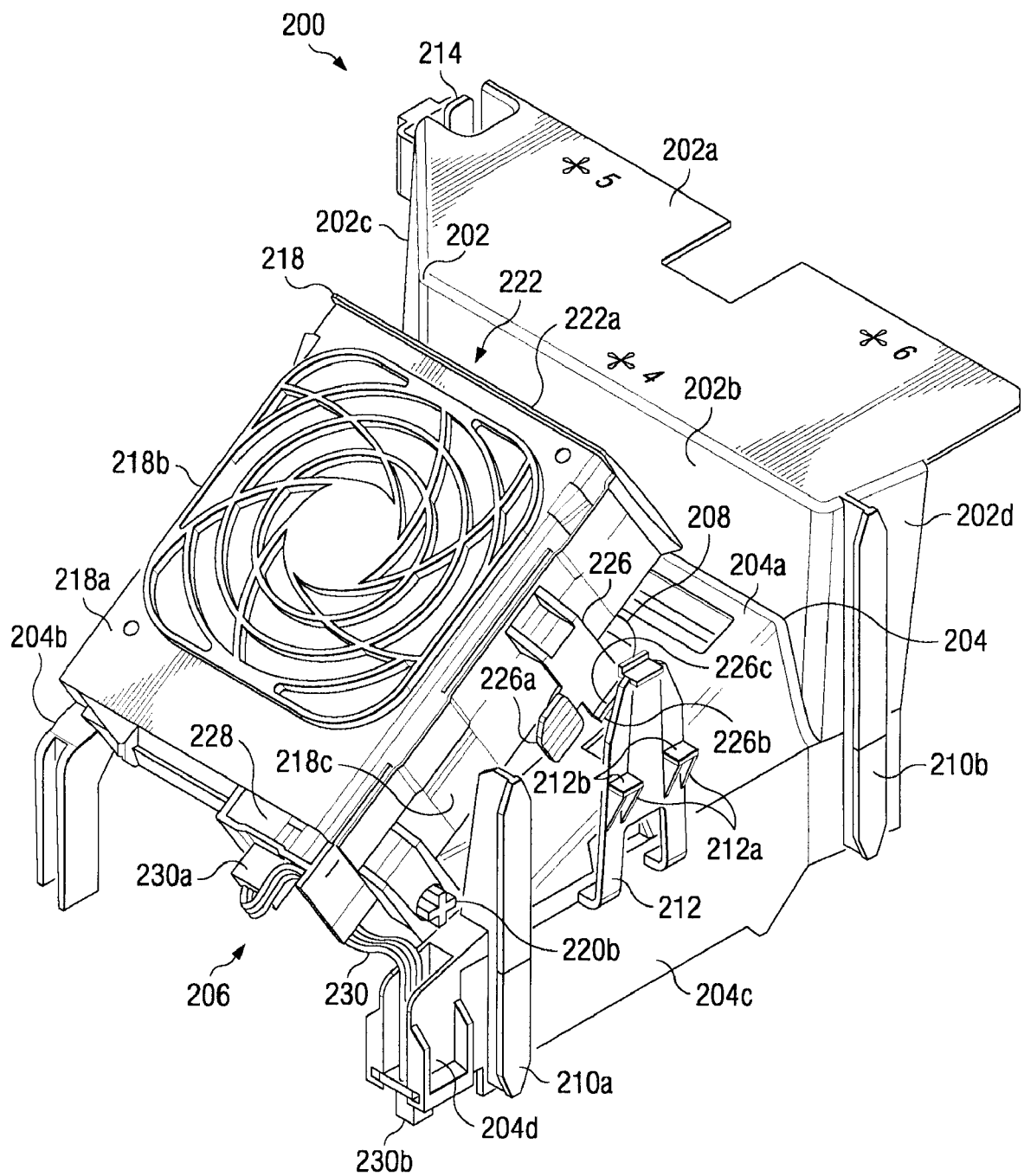
FIG. 2a is a perspective view illustrating an embodiment of a fan housing apparatus.
Figure 2B:
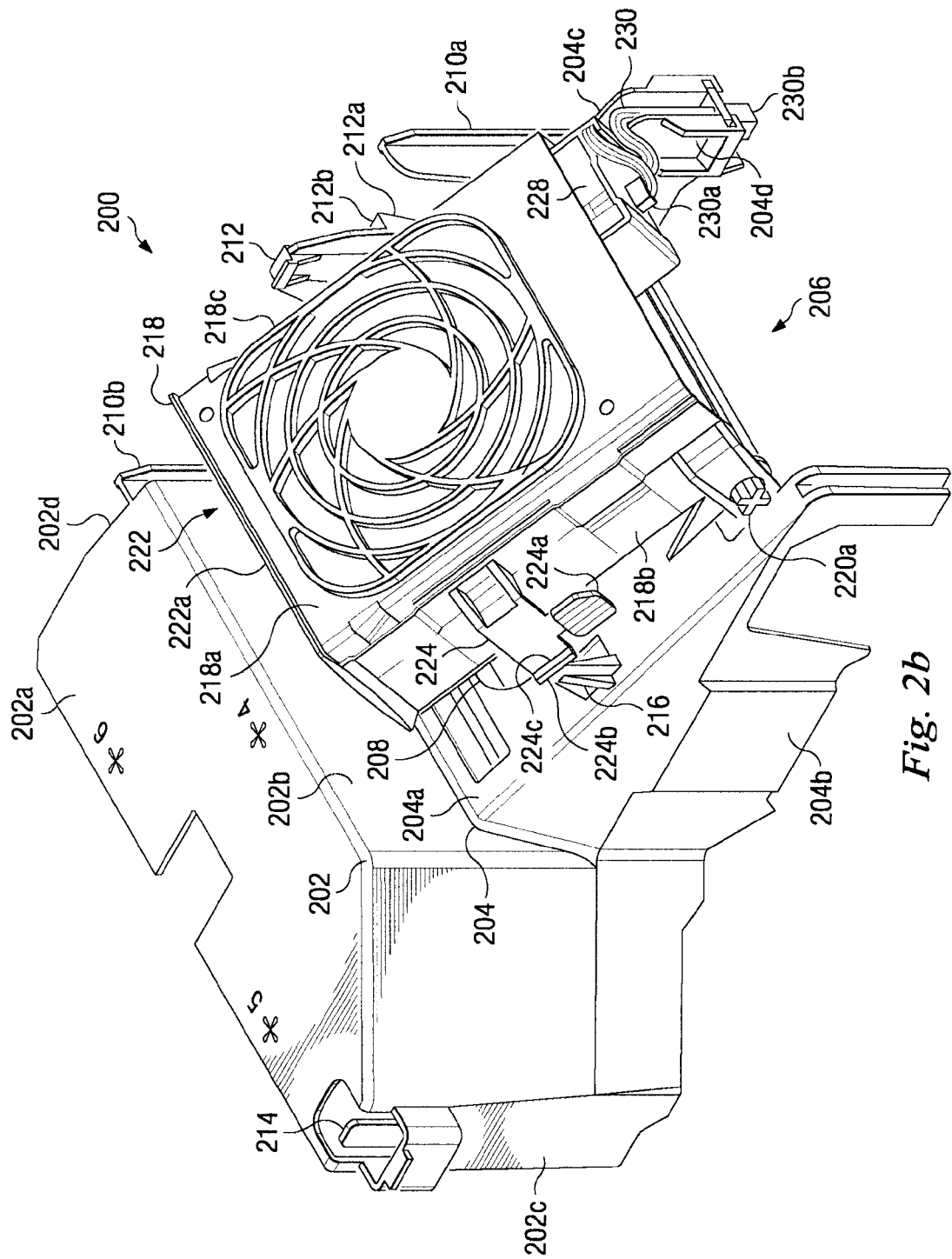

Referring now to FIGS. 2a and 2b, a fan housing apparatus 200 is illustrated. The fan housing apparatus 200 includes a first shroud base 202 having a top wall 202a, a front wall 202b extending substantially perpendicularly from the top wall 202a, and a pair of opposing side walls 202c and 202d extending between the top wall 202a and the front wall 202b. A second shroud base 204 extends from the front wall 202b of the first shroud base 202 and includes a top wall 204a and a pair of opposing side walls 204b and 204c extending from the top wall 204a in a substantially parallel orientation to each other. A plug coupling 204d is located on the side wall 204c adjacent a bottom edge of the side wall 204c. A shroud housing 206 is defined by the first shroud base 202 and the second shroud base 204 between the side walls 202c, 202d, 204b, 204c and the top walls 202a and 204a. An air passageway 208 is defined by the top wall 204a of the second shroud base 204 and extends through the top wall 204a to the shroud housing 206. A guide feature 210a is located on the side wall 204c of the second shroud base 204 and a guide feature 210b is located on the side wall 202c of the first shroud feature 202 in a substantially parallel orientation to the guide feature 210a. A securing feature 212 is located on the side wall 204c of the second shroud base 204 and includes a beveled surface 212a and a securing surface 212b located adjacent the beveled surface 212a. A securing feature 214 is located on the side wall 202c of the first shroud base 202 and may include a beveled surface and stop surface (not shown) similar to the beveled surface 212a and the stop surface 212b on the securing feature 212. A service position support member 216 extends from the top wall 204a of the second shroud base 204 and is located adjacent the side wall 204b of the second shroud base 204. A service position support member (not shown) may also extend from the top wall 204a of the second shroud base 204 and be located adjacent the side wall 204c of the second shroud base 204 opposite the service position support member 216 and adjacent the securing feature 212.

A housing member 218 includes a front wall 218a and a pair of opposing side walls 218b and 218c extending from the front wall 218a in a substantially parallel orientation to each other. A pair of pivotal couplings 220a and 220b engage the sides walls 218b and 218c, respectively, on the housing member 218 and the top wall 204 of the second shroud base 204 in order to pivotally couple the housing member 218 to the second shroud base 204 adjacent the air passageway 208. A fan housing 222 is defined by the housing member 218, located between the front wall 218a and the side walls 218b and 218c, and includes an entrance 222a located adjacent the front wall 202b of the first shroud base 202. A flexible beam 224 extends from the side wall 218b of the housing member 218 and includes a release handle 224a, a service surface 224b, and a securing surface 224c. A flexible beam 226 extends from the side wall 218c of the housing member 218 and includes a release handle 226a, a service surface 226b, and a securing surface 226c. A plug coupling 228 is located on the housing member 218 and extends between the front wall 218a and the side wall 218c opposite the entrance 222a of the fan housing 222. A cable 230 including a first plug 230a and a second plug 230b is coupled to the second shroud base 204 and the housing member 218 through the engagement of the first plug 230a with the plug coupling 228 on the housing member 218 and the engagement of the second plug 230b with the plug coupling 204d on the second shroud base 204.

Figure 3:
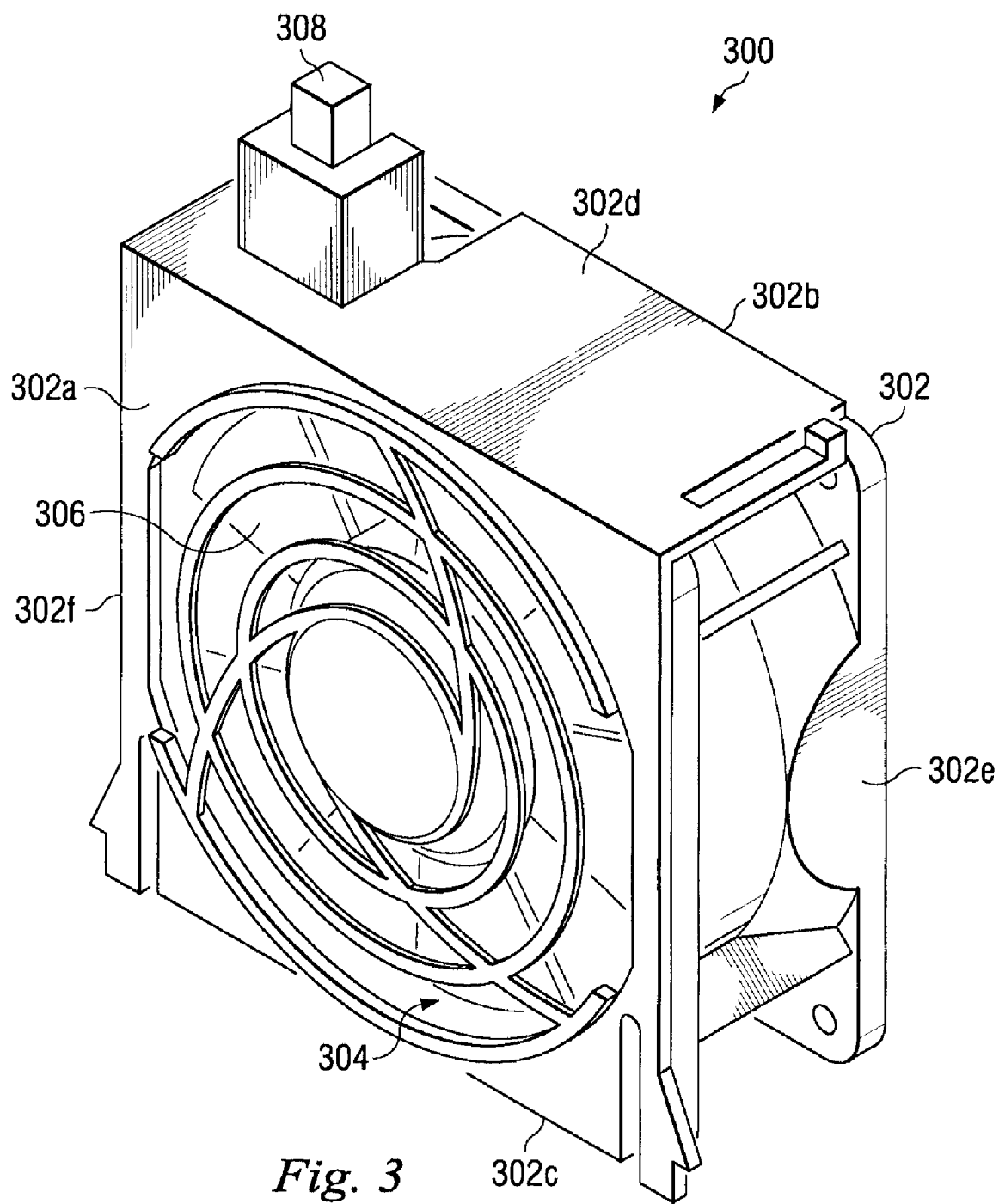
FIG. 3 is a perspective view illustrating an embodiment of a fan module used with the fan housing apparatus of FIGS. 2a and 2b.

Referring now to FIG. 3, a fan module 300 is illustrated. The fan module 300 includes a base 302 having a front surface 302a, a rear surface 302b located opposite the front surface 302a, a top surface 302c extending between the front surface 302a and the rear surface 302b, a bottom surface 302d located opposite the top surface 302c and extending between the front surface 302a and the rear surface 302b, and a pair of opposing side surfaces 302e and 302f extending between the front surface 302a, the rear surface 302b, the top surface 302c, and the bottom surface 302d. A housing 304 is defined by the base 302 between the front surface 302a, the rear surface 302b, the top surface 302c, the bottom surface 302d, and the side surfaces 302e and 302f. A fan 306 is located in the housing 304. A plug 308 extends from the bottom surface 302d of the base 302 and is located adjacent the side surface 302f.

Figure 4:
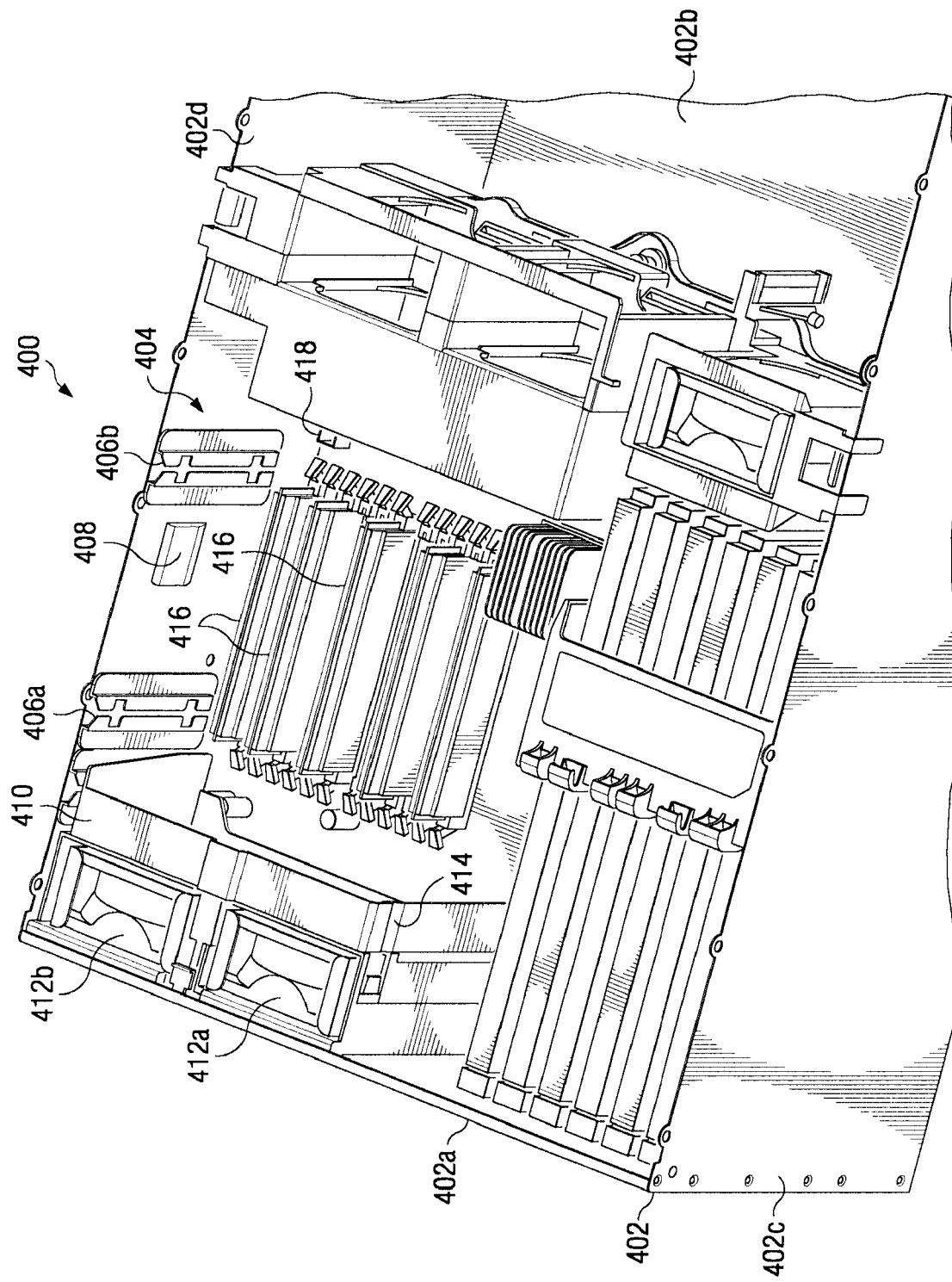
FIG. 4 is a perspective view illustrating an embodiment of a chassis used with the fan housing apparatus of FIGS. 2a and 2b and the fan module of FIG. 3.

Referring now to FIG. 4, chassis 400 is illustrated. The chassis 400 may be the chassis 116, described above with reference to FIG. 1, and may house some or all of the components of the IHS 100, described above with reference to FIG. 1. The chassis 400 includes a base 402 having a front wall 402a, a bottom wall 402b extending substantially perpendicularly from the front wall 402a, and a pair of opposing side walls 402c and 402d extending between the front wall 402a and the bottom wall 402b. An IHS housing 404 is defined by the base 402 between the front wall 402a, the bottom wall 402b, and the side walls 402c and 402d. A pair of guide channels 406a and 406b are defined by the side wall 402d and located on the side wall 402d in a spaced apart orientation. A securing member 408 is located on the side wall 402d and between the guide channels 406a and 406b. A shroud coupling frame 410 extends between the side wall 402d and the front wall 402a, is located in the IHS housing 404, and houses a plurality of fans 412a and 412b. A securing channel 414 is defined by the shroud coupling frame 410 and located on the shroud coupling frame 410 opposite the side wall 402d. A plurality of heat producing components 416 which may be, for example, the system memory 114, described above with reference to FIG. 1, FBDIMMs, or a variety of other heat producing components known in the art, are coupled to the chassis 400 and located in the IHS housing 404. A socket 418 extends from the bottom wall 402b of the chassis 400 and is located adjacent the heat producing components 416 in the IHS housing 404.

Figure 5B:
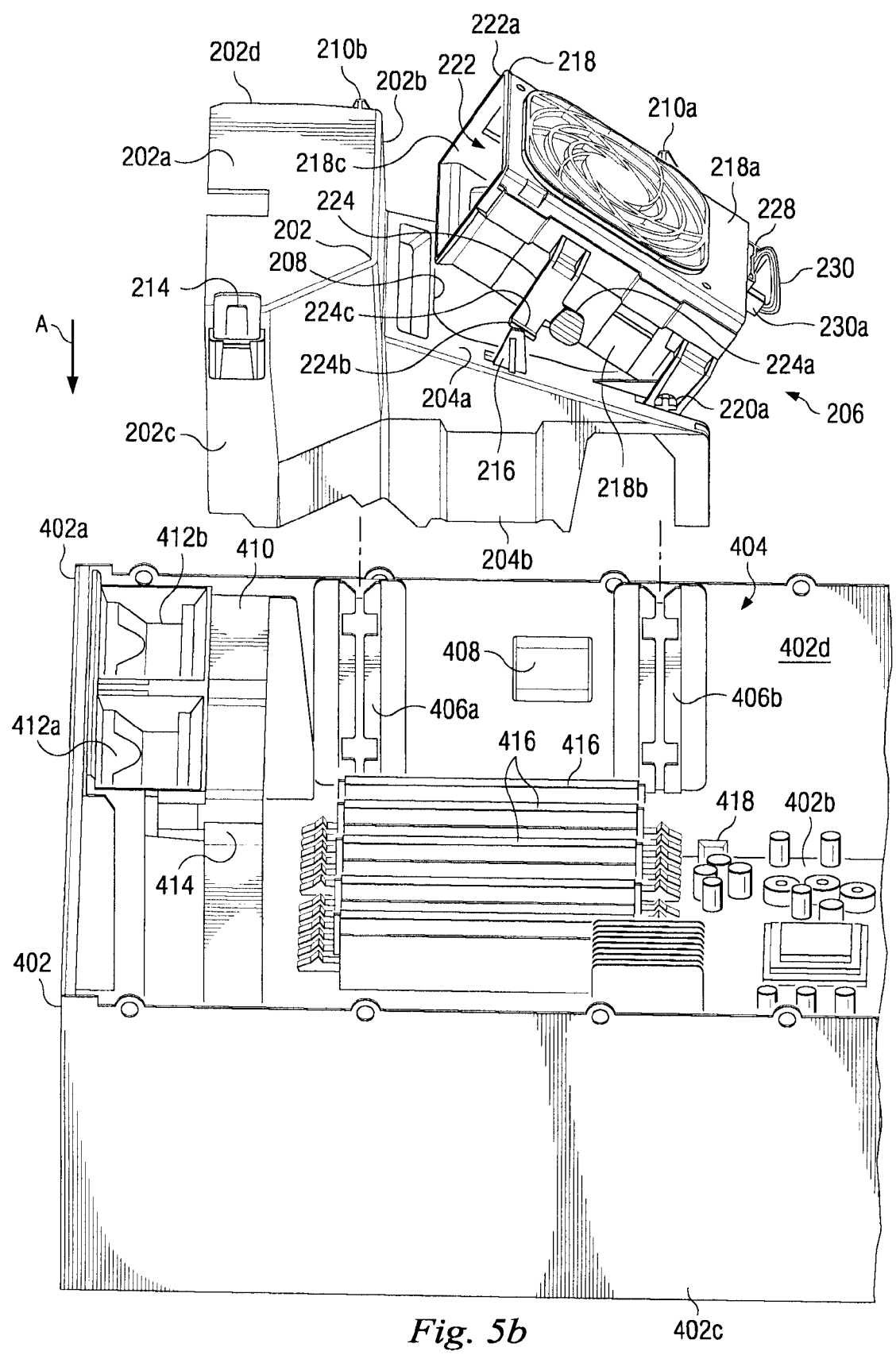
FIG. 5b is a perspective view illustrating an embodiment of the fan housing apparatus of FIGS. 2a and 2b being coupled to the chassis of FIG. 4.
Figure 5C:
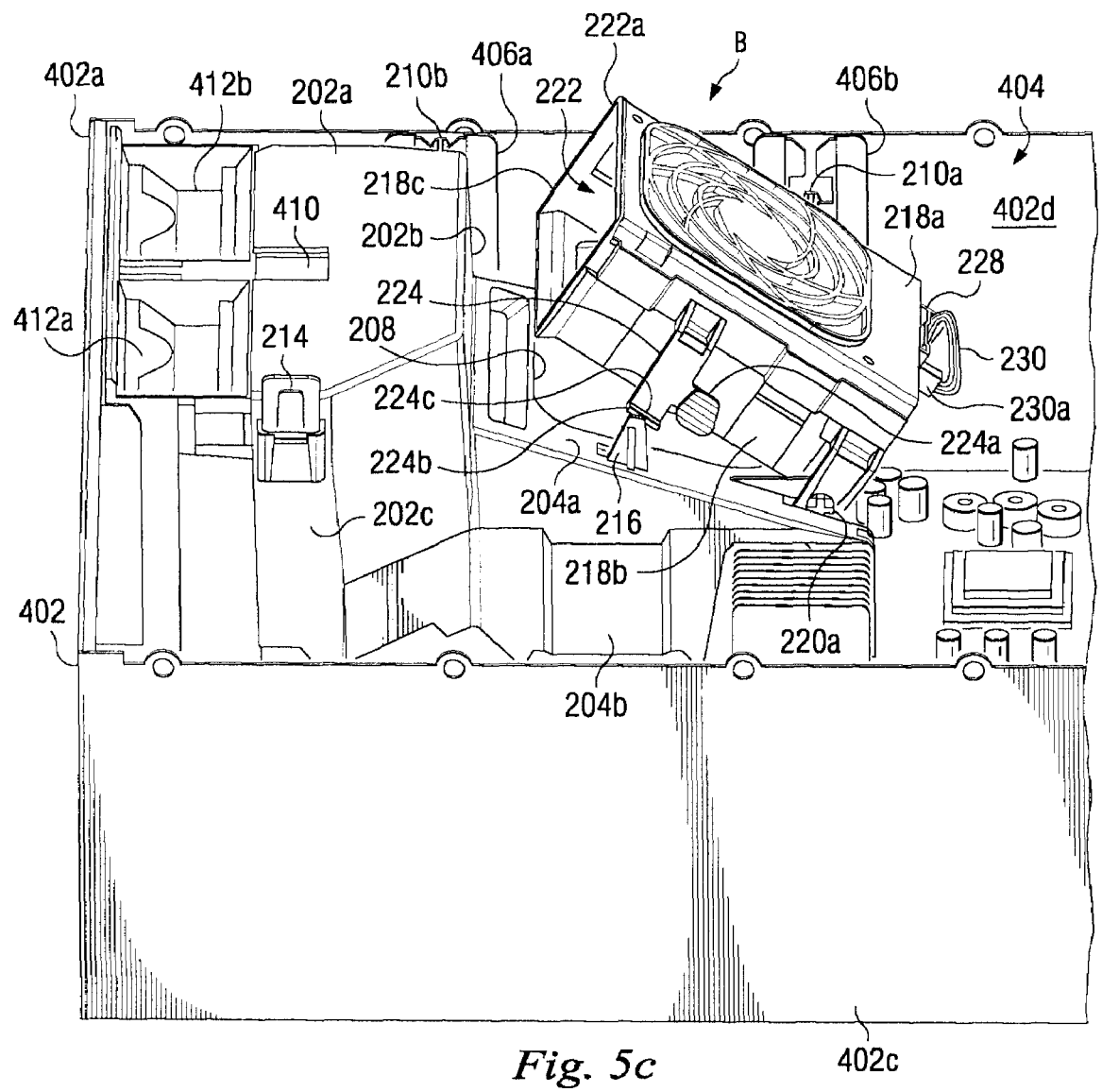
FIG. 5c is a perspective view illustrating an embodiment of the fan housing apparatus of FIGS. 2a and 2b coupled to the chassis of FIG. 4.

Referring now to FIGS. 2a, 2b, 4, 5a, 5b and 5c, a method 500 for cooling a heat producing component is illustrated. The method 500 begins at step 502 where the chassis 400 with the heat producing components 416, illustrated in FIG. 4, is provided. The method 500 then proceeds to step 504 where the fan housing apparatus 200 including the first shroud base 202, the second shroud base 204, and the housing member 218, is coupled to the chassis 400. The fan housing apparatus 200 is positioned adjacent the chassis 400 such that the first shroud base 202 on the fan housing apparatus 200 is located adjacent the shroud coupling frame 410 on the chassis 400, the side walls 202d and 204c of the first shroud base 202 and the second shroud base 204, respectively, are adjacent the side wall 402d of the chassis 400, the guide features 210a and 210b on the fan housing apparatus 200 are aligned with the guide channels 406b and 406a on the chassis 400, respectively, and the second plug 230b on the fan housing apparatus 200 is aligned with the socket 418 on the chassis 400, as illustrated in FIG. 5b. The fan housing apparatus 200 is then moved in a direction A such that the fan housing apparatus 200 enters the IHS housing 404. As the fan housing apparatus 200 enters the IHS housing, the guide features 210a and 210b engage the guide channels 406b and 406a, respectively, and align the fan housing apparatus 200 for coupling to the chassis 400 and blind mating the second plug 230b with the socket 418. Continued movement of the fan housing apparatus 200 in the direction A results the beveled surface 212a on the securing feature 212 of the fan housing apparatus 200 engaging the securing member 408 on the chassis 400 and deflecting the securing feature 212 such that the fan housing apparatus 200 may continue to move in the direction A until the securing surface 212b engages the securing member 408 to secure the fan housing apparatus 200 in the chassis 400. The securing feature 214 may engage the securing channel 414 defined by the shroud coupling frame 410 in substantially the same manner as the securing feature 212 and the securing member 408 in order to secure the fan housing apparatus 200 in the chassis 400, as illustrated in FIG. 5c. During the securing of the fan housing apparatus 200 to the chassis 400, the second plug 230b engages the socket 418 and electrically couples the first plug 230a to the socket 418 which may be coupled to a processor housed in the chassis 400 such as, for example, the processor 102 described above with reference to FIG. 1. With the fan housing apparatus 200 coupled to the chassis 400, the heat producing components 416 in the chassis 400 are located in the shroud housing 206 defined by the fan housing apparatus 200.

Referring now to FIGS. 2a, 2b, 3, 5a and 5c, the method 500 proceeds to step 506 where the housing member 218 is moved to a service position. The housing member 218 is pivotally coupled to the second shroud base 204 on the pivotal couplings 220a and 220b such that the housing member 218 may rotate about the pivotal couplings 220a and 220b relative to the first shroud base 202 and the second shroud base 204. As the housing member 218 rotates about the pivotal couplings 220a and 220b and away from the top wall 204a, the flexible beams 224 and 226 engage the service position support member 216 located adjacent the side wall 204b and the service position support member (not shown) located adjacent the side wall 204c, respectively, such that the flexible beams 224 and 226 are deflected in order to allow the service surfaces 224b and 226b on the flexible beams 224 and 226, respectively, to engage the service position support member 216 located adjacent the side wall 204b and the service position support member (not shown) located adjacent the side wall 204c, respectively, and support the housing member 218 in a service position A, illustrated in FIG. 5c. With the housing member 218 in the service position A, the fan housing 222 is accessible and not obstructed by the front wall 202b of the first shroud base 202 such that a fan module may be positioned in the fan housing 222.

Figure 5D:
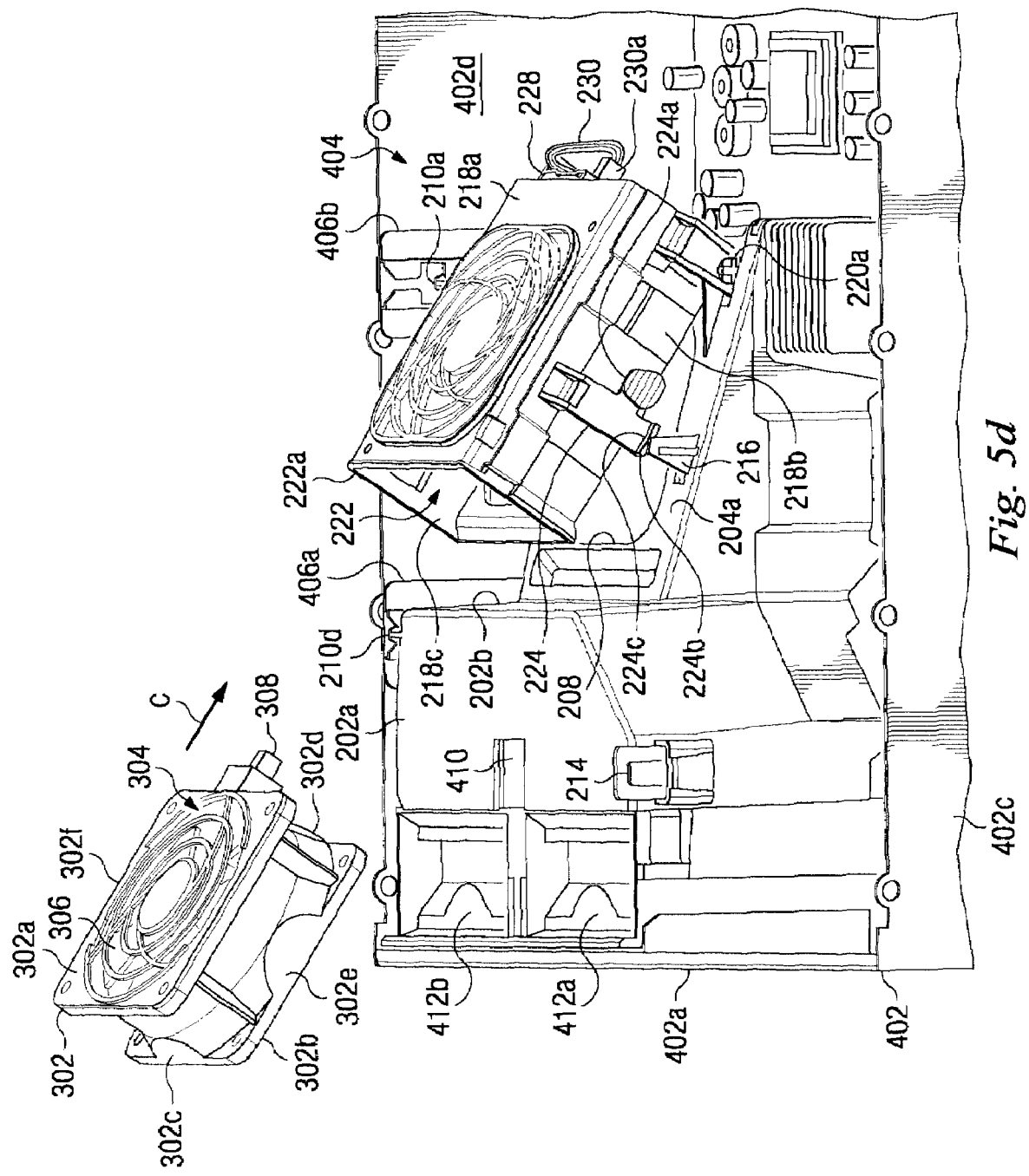
FIG. 5d is a perspective view illustrating an embodiment of the fan module of FIG. 3 being coupled to the fan housing apparatus and chassis of FIG. 5c.
Figure 5E:
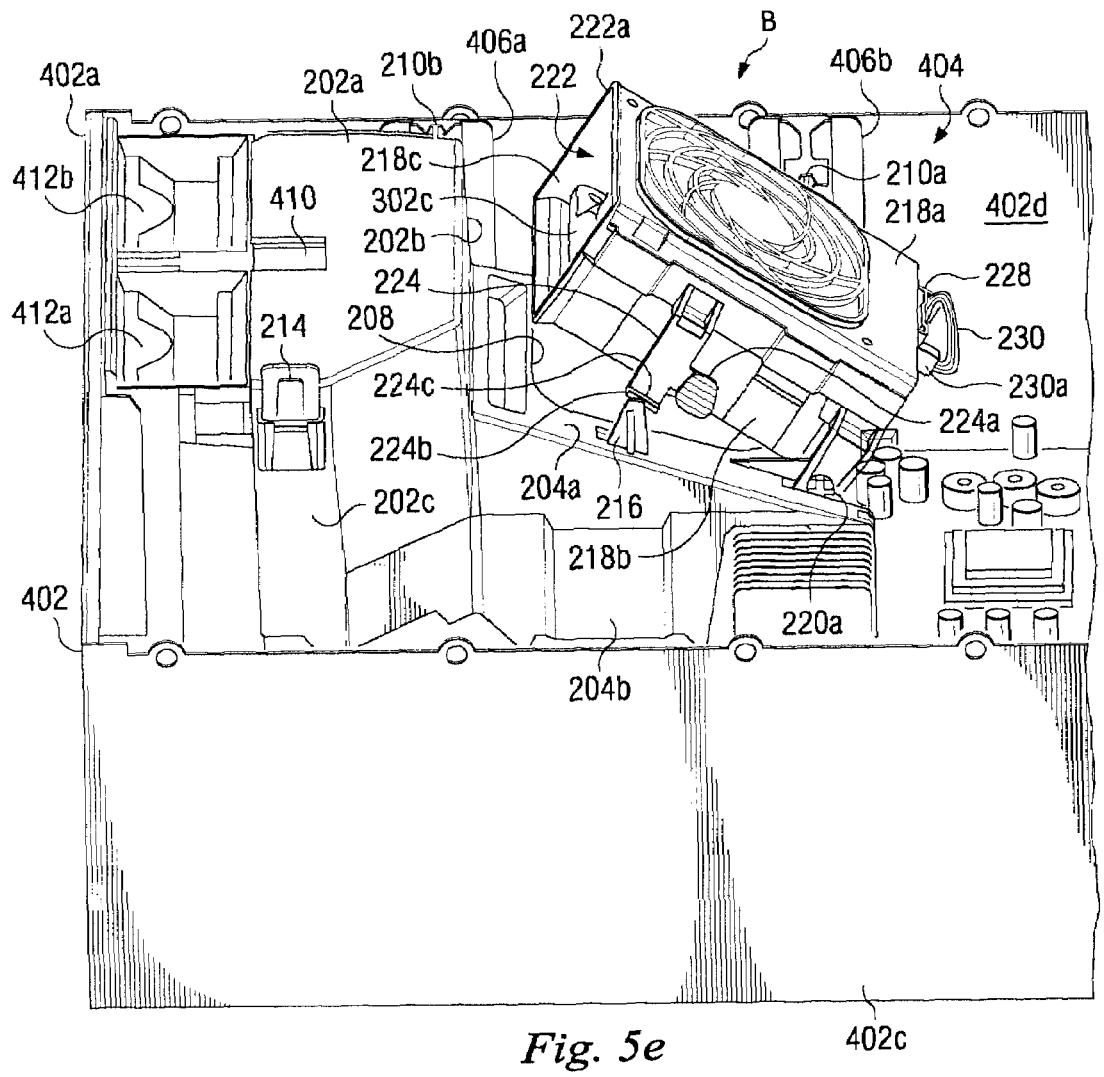
FIG. 5e is a perspective view illustrating an embodiment of the fan module of FIG. 3 coupled to the fan housing apparatus and chassis of FIG. 5c.
Figure 5F:
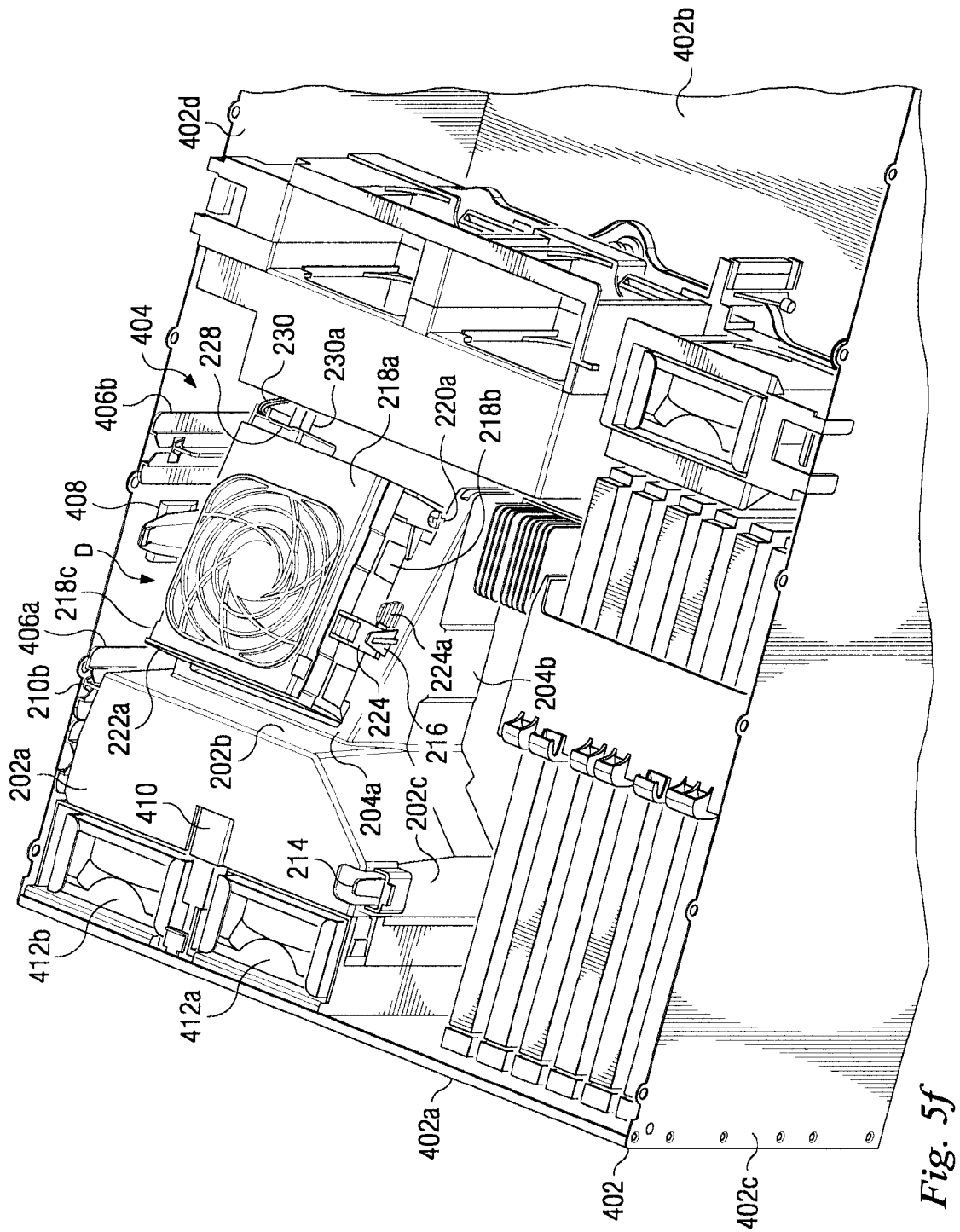
FIG. 5f is a perspective view illustrating an embodiment of the fan module, the fan housing apparatus, and the chassis of FIG. 5e with the housing member on the fan housing apparatus in an operating position.

Referring now to FIGS. 2a, 2b, 3, 5a, 5d and 5e, the method 500 then proceeds to step 508 where the fan module 300, illustrated in FIG. 3, is coupled to the housing member 218. The fan module 300 is positioned adjacent the housing member 218 such that the bottom surface 302d of the fan module 300 is located adjacent the entrance 222a of the fan housing 222 defined by the housing member 218, with the front surface 302a of the fan module 300 adjacent the front wall 218a of the housing member 218 and the side surfaces 302e and 302f of the fan module 300 adjacent the side walls 218b and 218c, respectively, of the housing member 218, as illustrated in FIG. 5d. The fan module 300 is then moved in a direction C such that the fan module 300 enters the fan housing 222 defined by the housing member 218. Because the housing member 218 is in the service position B, the fan module 300 may enter the fan housing 222 without interference from the first shroud base 202. In an embodiment, the fan module 300 includes features which allow the fan module 300 to be secured to the housing member 218 in the fan housing 222. With the fan module 300 located in the fan housing 222, illustrated in FIG. 5e, the plug 308 on the fan module 300 is electrically coupled to the first plug 230a on the cable 230 that is coupled to the fan housing apparatus 200 and the socket 418 in the chassis 400. In an embodiment, step 508 of the method 500 results in the fan module 300 being hot plugged to the housing member 218 through the cable 230, the first plug 230a, and the second plug 230b.

Referring now to FIGS. 2a, 2b, 3, 5a, 5c, 5e and 5f, the method 500 proceeds to step 510 where the housing member 218 is moved to an operating position. The housing member 218 is pivotally coupled to the second shroud base 204 on the pivotal couplings 220a and 220b such that the housing member 218 may rotate about the pivotal couplings 220a and 220b relative to the first shroud base 202 and the second shroud base 204. The release handles 224a and 224b on the flexible beams 224 and 226, respectively, are engaged for example, using one hand to move both of the flexible beams 224 and 226 towards the housing member 218, such that the service surfaces 224b and 226b on the flexible beams 224 and 226, respectively, disengage the service position support member 216 located adjacent the side wall 204b and the service position support member (not shown) located adjacent the side wall 204c, respectively, and the housing member 218 is then free to rotate from the service position B, about the pivotal couplings 220a and 220b, and towards the top wall 204a of the second shroud base 204. As the housing member 218 engages the top wall 204a of the second shroud base 204, the securing surfaces 224c and 226c on the flexible beams 224 and 226, respectively, may engage a feature (not shown) on the second shroud base 204 in order to secure the housing member 218 in an operating position D, illustrated in FIG. 5f. With the housing member 218 in the operating position D, the fan module is located adjacent the air passageway 208 defined by the second shroud base 204 and adjacent the heat producing components 416, while the fan housing 222 is inaccessible and obstructed by the front wall 202b of the first shroud base 202 such that the fan module 300 may not be removed from the fan housing 222.

The method 500 then proceeds to step 512 where the heat producing components 416 located in the chassis 400 are cooled with the fan module 300. With the housing member 218 in the operating position D, the fan module 300 is located adjacent the air passageway 208, the shroud housing 206, and the heat producing components 416. The fan module 300 may then be operated by receiving power through the cable 230 in order to create an airflow over the heat producing components 416. In addition, the fans 412a and 412b in the chassis 400 may also be operated to create additional airflow to cool the heat producing components 416. Thus, a method and apparatus are provided which allow a shroud and fan housing to be coupled to a chassis without the use of a tool and then allow a fan to be coupled to the chassis using a constrained space in the chassis. The fan module 300 may be removed from the housing member 218 by first rotating the housing member 218 about the pivotal couplings 220a and 220b and away from the top wall 204a such that the flexible beams 224 and 226 engage the service position support member 216 located adjacent the side wall 204b and the service position support member (not shown) located adjacent the side wall 204c, respectively, and the flexible beams 224 and 226 are deflected in order to allow the service surfaces 224b and 226b on the flexible beams 224 and 226, respectively, to engage the service position support member 216 located adjacent the side wall 204b and the service position support member (not shown) located adjacent the side wall 204c, respectively, and support the housing member 218 in a service position A, illustrated in FIG. 5c. The fan module 300 may then be removed from the fan housing 222. The fan housing apparatus 200 may be removed from the chassis 400 without the use of a tool by releasing the securing features 212 and 214 on the fan housing apparatus 200 from the chassis 400 and moving the fan housing apparatus 200 in a direction opposite to the direction A, illustrated in FIG. 5b.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A fan housing apparatus, comprising:
    a shroud defining an air passageway, the shroud comprising a service position support member;
    a housing member adjacent the air passageway and moveably coupled to the shroud such that the housing member is moveable relative to the shroud between an operating position and a service position; and
    a fan housing defined by the housing member, whereby the fan housing is inaccessible when the housing member is in the operating position and the fan housing is accessible when the housing member is in the service position.

2. The apparatus of claim 1, wherein the shroud comprises a guide feature.

3. The apparatus of claim 1, wherein the shroud comprises a securing feature.

4. The apparatus of claim 1, wherein the housing member is pivotally coupled to the shroud.

5. The apparatus of claim 1, wherein the housing member comprises a flexible beam that is operable to support the housing member in the service position and secure the housing member to the shroud in the operating position.

6. The apparatus of claim 1, further comprising:
    a cable coupled to the shroud and the housing member, wherein the cable comprises a first plug adjacent the fan housing and a second plug adjacent an edge of the shroud.

7. The apparatus of claim 1, further comprising:
    a fan module in the fan housing and coupled to the housing member.

8. An information handling system, comprising:
    a chassis;
    a processor coupled to the chassis;
    a heat producing component in the chassis;
    a shroud coupled to the chassis and defining an air passageway adjacent the heat producing component, the shroud comprising a service position support member;
    a housing member adjacent the air passageway and moveably coupled to the shroud such that the housing member is moveable relative to the shroud between an operating position and a service position; and
    a fan housing defined by the housing member, whereby the fan housing is inaccessible when the housing member is in the operating position and the fan housing is accessible when the housing member is in the service position.

9. The system of claim 8, wherein the shroud comprises a guide feature coupling the shroud to the chassis.

10. The system of claim 8, wherein the shroud comprises a securing feature securing the shroud to the chassis.

11. The system of claim 8, wherein the housing member is pivotally coupled to the shroud.

12. The system of claim 8, wherein the housing member comprises a flexible beam that is operable to support the housing member in the service position and secure the housing member to the shroud in the operating position.

13. The system of claim 8, further comprising:
    a cable coupled to the shroud and the housing member, wherein the cable comprises a first plug adjacent the fan housing and a second plug adjacent an edge of the shroud and engaging a socket in the chassis such that the cable is electrically coupled to the processor.

14. The system of claim 8, further comprising:
    a fan module located in the fan housing and coupled to the housing member.

15. The system of claim 8, wherein the heat producing component is a memory device.

16. A method for cooling a heat producing component, comprising:
    providing a chassis comprising a heat producing component and a shroud, the shroud comprising a service position support member positioned adjacent the heat producing component, wherein the shroud comprises a housing member moveably coupled to the shroud;
    moving the housing member relative to the shroud and into a service position;
    positioning a fan module in a fan housing defined by the housing member;
    moving the housing member relative to the shroud and into an operating position; and
    cooling the heat producing component by operating the fan module.

17. The method of claim 16, further comprising:
    coupling the shroud to the chassis by engaging a guide feature that is located on the shroud with the chassis and engaging a securing feature that is located on the shroud with the chassis.

18. The method of claim 17, wherein the positioning a fan module in a fan housing comprises electrically coupling the fan module to a processor that is located in the chassis.

* * * * *